(12) United States Patent
Morimoto

(10) Patent No.: US 7,588,815 B2
(45) Date of Patent: Sep. 15, 2009

(54) MASK BLANK FOR CHARGED PARTICLE BEAM EXPOSURE, METHOD OF FORMING MASK BLANK AND MASK FOR CHARGED PARTICLE BEAM EXPOSURE

(75) Inventor: Kenichi Morimoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 389 days.

(21) Appl. No.: 10/737,393

(22) Filed: Dec. 16, 2003

(65) Prior Publication Data

US 2004/0178170 A1    Sep. 16, 2004

(30) Foreign Application Priority Data

Dec. 16, 2002  (JP)  ............... 2002-363726

(51) Int. Cl.
*B44C 1/22* (2006.01)
(52) U.S. Cl. .................. 428/119; 428/201; 428/428; 428/448; 428/450; 430/5
(58) Field of Classification Search .................. None
See application file for complete search history.

(56) References Cited

U.S. PATENT DOCUMENTS

| 3,941,629 | A | * | 3/1976 | Jaffe ........................... 438/16 |
| 3,959,038 | A | * | 5/1976 | Gutierrez et al. ............... 257/10 |
| 4,037,111 | A | * | 7/1977 | Coquin et al. .................. 378/35 |
| 4,171,489 | A | * | 10/1979 | Adams et al. .................. 378/35 |
| 4,198,263 | A | * | 4/1980 | Matsuda ........................ 216/12 |
| 4,451,544 | A | * | 5/1984 | Kawabuchi ..................... 430/5 |
| 4,468,799 | A | * | 8/1984 | Harms et al. ................... 378/35 |
| 4,606,803 | A | * | 8/1986 | Luthje et al. ............. 204/192.28 |
| 4,837,123 | A | * | 6/1989 | Kato et al. .................... 430/269 |
| 5,074,629 | A | * | 12/1991 | Zdeblick ....................... 385/14 |
| 5,166,962 | A | * | 11/1992 | Murooka et al. ............... 378/34 |
| 5,188,706 | A | * | 2/1993 | Hori et al. ..................... 216/12 |
| 5,196,283 | A | * | 3/1993 | Ikeda et al. .................... 430/5 |
| 5,422,921 | A | * | 6/1995 | Chiba .......................... 378/34 |
| 5,523,185 | A | * | 6/1996 | Goto ............................. 430/5 |
| 5,756,237 | A | * | 5/1998 | Amemiya ....................... 430/5 |
| 5,763,121 | A | * | 6/1998 | Randall ......................... 430/5 |
| 5,809,103 | A | * | 9/1998 | Smith et al. .................... 378/35 |
| 5,814,423 | A | * | 9/1998 | Maruyama et al. ............... 430/5 |

(Continued)

FOREIGN PATENT DOCUMENTS

EP        1065566 A2 *  1/2001

*Primary Examiner*—Allan Olsen
(74) *Attorney, Agent, or Firm*—patenttm.us

(57) ABSTRACT

The present invention provides a mask blank used for the charged particle beam exposure made by employing an SOI substrate having a silicon membrane higher reliability in quality, without the problem of deformation due to the compression stress of a silicon oxide film as an intermediate layer of the SOI substrate, and provides a method for forming a mask blank and a mask used for the charged particle beam exposure. The mask blank used for the charged particle beam exposure made by employing an SOI substrate having a front-side silicon membrane and a back-side silicon layer with a silicon oxide layer interposed therebetween is characterized in that the back-side silicon layer and the silicon oxide film of said SOI substrate are partially removed to form an opening to be an exposed region and an etching stop layer having lower stress is formed in the opening.

3 Claims, 6 Drawing Sheets

U.S. PATENT DOCUMENTS

| | | | |
|---|---|---|---|
| 5,846,676 A * | 12/1998 | Chiba et al. | 430/5 |
| 5,858,576 A * | 1/1999 | Takashi et al. | 430/5 |
| 6,066,418 A * | 5/2000 | Yoshihara | 430/5 |
| 6,192,100 B1 * | 2/2001 | Acosta et al. | 378/35 |
| 6,214,498 B1 * | 4/2001 | Choi | 430/5 |
| 6,316,151 B1 * | 11/2001 | Kim et al. | 430/5 |
| 6,468,701 B1 * | 10/2002 | Koba | 430/5 |
| 6,555,297 B1 * | 4/2003 | Lercel | 430/313 |
| 6,749,968 B2 * | 6/2004 | Mangat et al. | 430/5 |
| 6,835,508 B2 * | 12/2004 | Butschke et al. | 430/5 |
| 6,838,213 B2 * | 1/2005 | Kasica et al. | 430/5 |
| 6,913,857 B2 * | 7/2005 | Sasago et al. | 430/5 |
| 7,060,996 B2 * | 6/2006 | Moriya et al. | 250/492.23 |
| 2002/0001964 A1 * | 1/2002 | Choi | 438/719 |
| 2003/0003739 A1 * | 1/2003 | Butschke et al. | 438/689 |
| 2003/0071283 A1 * | 4/2003 | Heschel | 257/200 |
| 2004/0055401 A1 * | 3/2004 | Cunningham et al. | 73/865 |
| 2004/0087065 A1 * | 5/2004 | Udrea et al. | 438/140 |
| 2005/0053845 A1 * | 3/2005 | Becker et al. | 430/5 |
| 2005/0059204 A1 * | 3/2005 | Heschel | 438/222 |

* cited by examiner

MASK BLANK FOR CHARGED PARTICLE BEAM EXPOSURE, METHOD OF FORMING MASK BLANK AND MASK FOR CHARGED PARTICLE BEAM EXPOSURE

BACKGROUND OF THE INVENTION

The present invention relates to a method of forming a mask blank and a mask used for the lithography for manufacturing semiconductor devices and, more particularly, to a structure of a mask blank for fabricating a mask which transcribes a mask pattern onto a wafer using charged particle beams such as electron beams and ion beams and a method for forming a mask blank and a mask used for the charged particle beam exposure.

With miniaturization and increase in integration of semiconductor elements in semiconductor integrated circuits, an electron-beam projection lithography for transcribing a predetermined configuration onto a wafer using charged particle beams, especially using electron beams, was developed instead of the conventional photolithography using light. Recently, the development of EPL (Electron-beam Projection Lithography) method achieving higher throughput has advanced. As an electron-beam projection lithography, there is a method in which a prescribed mask pattern is divided into a plurality of sections, stencil masks formed with opening patterns each having a predetermined size and a predetermined arrangement are prepared, and electron beams are incident on the sections so that electron beams thus formed by the opening patterns are transcribed onto a wafer as a subject substrate on some reduced scale. There has been developed a system for forming a device pattern by combining prescribed patterns separately formed on the mask onto the subject substrate (for example, see Patent Document 1).

The stencil mask used for the aforementioned electron-beam projection lithography comprises a silicon membrane defining through-holes for transmitting electron beams in which a pattern region is divided and reinforced by a supporting grillage, referred to as "strut", from the back, thereby reducing the distortion of the pattern region and improving the accuracy of position of the pattern region. The typical method of forming a stencil mask will be described with reference to FIGS. 5(a)-5(e).

As shown in FIG. 5(a), as a substrate for a stencil mask, SOI (Silicon On Insulator) substrate 51 is conventionally used which has a silicon oxide film between silicon and silicon. An SOI substrate 51 is reliable because SOI substrates have been practically employed as semiconductor circuit substrates for LSI and a silicon membrane 52 as an upper layer for fabrication of pattern possesses higher reliability in quality concerning zero defects and thickness uniformity. The SOI substrate 51 has a structure in which two silicon crystal substrates are bonded with a silicon oxide film 53 intervened therebetween. A supporting silicon layer 54 to be a strut has a thickness of several hundreds µm, the silicon membrane 52 for forming a mask pattern has a thickness of several µm, and the silicon oxide film 53 which functions as an etching stop layer during fabrication of the mask blank and fabrication of the mask has a thickness of about 1 µm.

Masking material such as Cr for silicon etching is spattered onto the silicon membrane 52 for the fabrication of the mask pattern of the SOI substrate 51, thereby forming a hard mask layer 55 (FIG. 5(b)).

Then, a protective coat for etching is formed by photoresist or the like in order to form an opening in the back of the substrate corresponding to an exposed region and silicon is partially removed by way of dry-etching from the back of the substrate up to the silicon oxide film 53 functioning as the etching stop layer so as to form the opening 56. After that, the resist is removed, thereby forming a mask blank 58 (FIG. 5(c)).

An electron-beam resist is coated on the front-side hard mask layer 55. A predetermined pattern is formed by exposure of an electron-beam writer and is developed. The hard mask layer 55 is removed at exposed portions by way of etching so as to form a patterned hard mask layer 59. After the electron-beam resist is removed, the silicon membrane is removed at the exposed portions by way of dry-etching so as to form electron-beam through-holes 60. In this manner, a mask pattern 61 is formed (FIG. 5(d)).

Then, the patterned hard mask layer 59 is removed and the silicon oxide film as the etching stop layer 53 is removed at the opening 56, thereby forming a stencil mask 63 (FIG. 5(e)).

In order to prevent the deformation of the mask pattern layer 61 due to the compression stress of the residual silicon oxide film 62, boron or the like may be previously doped into the surface silicon membrane 52 of the SOI substrate 51 so as to impart tensile stress.

According to the conventional forming method as mentioned above, however, the silicon membrane is deformed due to the compression stress about 300 MPa of the silicon oxide film 53 interposed because the silicon layer supporting from the back is removed in the step of FIG. 5(c) where the backside silicon is partially removed by way of dry-etching to form the opening 56. As a result, distortion of about 20 µm is generated as shown in FIG. 6. As the mask is formed using the blank 58 with this distortion, a problem is caused that the position of the desired pattern such as LSI may be greatly shifted.

As an alternative method of the aforementioned forming method, there is a forming method without using SOI substrate as mask substrate (for example, see non patent document 1). This method includes forming an etching stop layer on silicon crystal plane by way of sputtering and further forming a silicon membrane on the etching stop layer by way of sputtering so as to prepare a mask substrate.

However, the silicon membrane which is required to have highest quality characteristics in the mask and mask blank is in amorphous state because the silicon membrane is formed by using sputtering technique in the method without using SOI substrate. Therefore unlike the single crystal silicon of the SOI substrate, the silicon membrane is not dense. If abnormal particles of silicon are generated, defects are produced. Accordingly, it is difficult to form a thin silicon layer without defects and having uniform thickness. Thus, there is a problem that it is hard to obtain a high quality mask using a mask blank prepared by this forming method.

[Patent Document 1]
Japanese Patent No. 2829942
[Non-patent Document 1]
Abstracts of The 46th International Conference on Electron, Ion and Photon Beam Technology and Nanofabrication, p401, "Fabrication of complete 8" stencil mask for electron projection lithography".

SUMMARY OF THE INVENTION

The present invention is made in order to solve the above described problems. It is an object of the present invention to provide a mask blank used for the charged particle beam exposure made by employing an SOI substrate with a silicon membrane having high reliability in quality, in which however there is no problem of deformation due to the compression stress of a silicon oxide film, as an intermediate layer of the SOI substrate, and to provide a method of forming such a mask blank and a mask used for the charged particle beam exposure.

In order to achieve the above described object, a mask blank used for the charged particle beam exposure according to the first aspect of the present invention is a mask blank which is made by employing an SOI substrate having a front-side silicon membrane and a back-side silicon layer with a silicon oxide film interposed therebetween, wherein the back-side silicon layer is partially removed to form an opening to be an exposed region of said SOI substrate, the silicon oxide film in the opening is removed, and an etching stop layer having lower stress is formed in the opening.

A mask blank for the charged particle beam exposure according to the second aspect of the present invention is a mask blank wherein the etching stop layer is made of any one selected from a group consisting of Cr, Ti, Ta, Mo, W, and Zr and nitrides, oxides, and oxynitrides of these metals.

A mask blank for the charged particle beam exposure according to the third aspect of the present invention is a mask blank wherein a hard mask layer made of any one selected from a group consisting of Cr, Ti, Ta, Mo, W, and Zr and oxides, nitrides, and oxynitrides of these metals is formed on the front-side silicon membrane of said mask blank used for the charged particle beam exposure.

A mask blank for the charged particle beam exposure according to the fourth aspect of the present invention is a mask blank wherein the etching stop layer and said hard mask layer are made of the same material.

A method of forming a mask blank used for the charged particle beam exposure according to the fifth aspect of the present invention is a method of forming a mask blank made by employing an SOI substrate having a front-side silicon membrane and a back-side silicon layer with a silicon oxide film interposed therebetween, comprising: sequentially, a step of partially removing the back-side silicon layer of said SOI substrate so as to form an opening as an exposed region; a step of partially removing the silicon oxide film at the portion exposed to the opening; and a step of forming an etching stop layer in the opening.

A method of forming a mask blank used for the charged particle beam exposure according to the sixth aspect of the present invention is a method further comprising a step of forming a hard mask layer on the front-side silicon membrane of said SOI substrate.

A method of forming a mask used for the charged particle beam exposure according to the seventh aspect of the present invention is a method of forming a mask by employing an SOI substrate having a front-side silicon membrane and a back-side silicon layer with a silicon oxide film interposed therebetween, comprising, sequentially, a step of partially removing the back-side silicon layer of said SOI substrate so as to form an opening as an exposed region; a step of partially removing the silicon oxide film at the portion exposed to the opening; a step of forming an etching stop layer in the opening; a step of etching the front-side silicon membrane of said SOI substrate according to a pattern so as to form a mask pattern; and a step of removing said etching stop layer.

A method of forming a mask used for the charged particle beam exposure according to the eighth aspect of the present invention is a method wherein said step of etching the front-side silicon membrane of said SOI substrate including: a step of forming a hard mask layer on said silicon membrane, etching said hard mask layer according to the pattern, and etching said silicon membrane according to the pattern so as to form the mask pattern; and a step of removing the patterned hard mask layer after the fabrication of said mask pattern.

A method of forming a mask used for the charged particle beam exposure according to the ninth aspect of the present invention is a method wherein said etching stop layer and said patterned hard mask layer are removed at the same time.

According to a method of forming a mask blank and a mask for the charged particle beam exposure of the present invention as mentioned above, after etching the silicon to the silicon oxide film as the intermediate layer by work on the back side of the SOI substrate, the silicon oxide film having higher stress existing in the opening is removed and, instead of the removed silicon oxide film, an etching stop layer having lower internal stress is freshly formed. With this structure, a blank made by employing an SOI substrate having higher reliability in quality concerning zero defects and thickness uniformity, in which however there is no problem of deformation of a silicon membrane can be obtained. By using this blank, the shift of position of pattern due to the internal stress of the etching stop layer can be reduced so that a mask used for charged particle beam exposure can be obtained which has excellent quality and has a pattern of high accuracy of position.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Hereinafter, embodiments of the present invention will be described, taking electron-beam exposure which is most likely expected to be in practical use among charged particle beam exposure technologies for example. Description will now be made as regard to a mask blank used for the electron-beam exposure and its forming method, and a method of forming a mask used for the electron-beam exposure with reference to the attached drawings.

(Mask Blank Used for the Charged Particle Beam Exposure)

Figure 1:
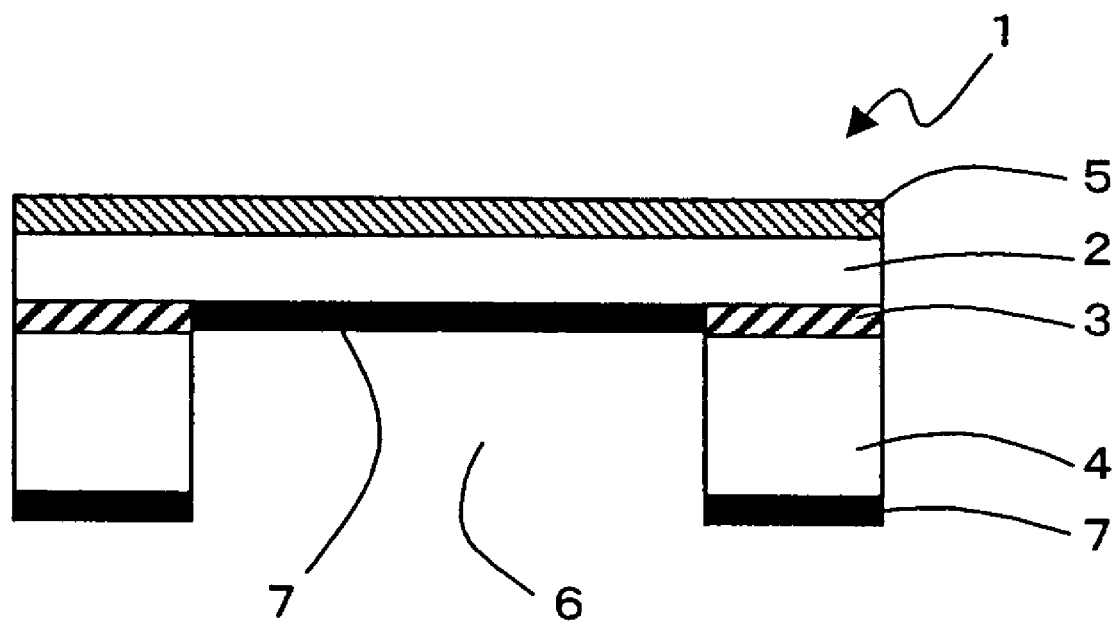
FIG. 1 is a partial sectional view showing an embodiment of a mask blank used for the electron-beam exposure according to the present invention.

FIG. 1 is a partial vertical sectional view schematically showing an embodiment of a mask blank used for the electron beam exposure according to the present invention which is used for a stencil mask used for an electron-beam projection lithography. In FIG. 1, a mask blank 1 used for the electron-beam exposure has a structure comprising struts (supporting silicon layer) 4 made of silicon, a silicon membrane 2 which is bonded to the supporting silicon layer 4 with a silicon oxide film 3 interposed therebetween and in which a pattern is formed, a hard mask layer 5 formed on the silicon membrane 2, an opening 6 to be an exposed region which is formed by partially removing the back-side silicon of an SOI substrate and the silicon oxide film 3, and an etching stop layer 7 having lower stress which is formed in the opening.

The SOI substrate used in the present invention as mask material may be any of various SOI substrates having a single crystal silicon membrane 2 and a single crystal supporting silicon layer 4 with a silicon oxide film 3 interposed therebetween. Examples of SOI substrate include a substrate in which a silicon oxide film is formed on a silicon wafer by way of thermal oxidation and a silicon wafer is bonded on the silicon oxide film and is polished, an ELTRAN (Epitaxial Layer Transfer) substrate using an epitaxial silicon, and an SIMOX (Separation by Implanted Oxygen) substrate formed by way of oxygen ion implantation. The thickness of the back-side supporting silicon layer 4 of the SOI substrate is 500 µm to 725 µm, the thickness of the silicon oxide film 3 is about 0.2 µm to 1 µm, and the thickness of the front-side silicon membrane 2 is about 1 µm to several µm. These values as well as the size of the SOI substrate depend on a lithography system and a mask configuration used.

The etching stop layer 7 used in the present invention functions as an etching stop layer during the dry-etching of the front-side silicon membrane 2. The etching stop layer 7 is made of a material which provides a lower internal stress to the etching stop layer 7 after formed, i.e. one selected from a group consisting of Cr, Ti, Ta, Mo, W, and Zr and nitrides, oxides, and oxynitrides of these metals.

The internal stress of the etching stop layer 7 for preventing the deformation of the silicon membrane 2 is preferably in a range from −10 MPa to +10 MPa. Minus "−" represents the compression stress and plus "+" represents the tensile stress.

The thickness of the etching stop layer 7 is in order of 100 nm to 1 µm and can be formed by way of sputtering technique or CVD technique so as to control its stress.

In the mask blank used for the electron beam exposure of the present invention, the hard mask layer 5 and the etching stop layer 7 may be made of the same material. Since the hard mask layer 5 and the etching stop layer 7 are removed by way of etching at the final process of the mask fabrication, the hard mask layer 5 and the etching stop layer 7 are preferably made of the same material in terms of reduction of film deposition equipment, reduction of etching equipment, and reduction of process because both can be removed by a single etching process.

The hard mask layer 5 formed on the front-side silicon membrane 2 of the mask blank 1 of the present invention is a thin film which is made of any one selected from a group consisting of Cr, Ti, Ta, Mo, W, and Zr and oxides, nitrides, and oxynitrides of these metals and is formed by way of vacuum film deposition method such as sputtering to have a thickness of several hundreds nm.

Figure 2:
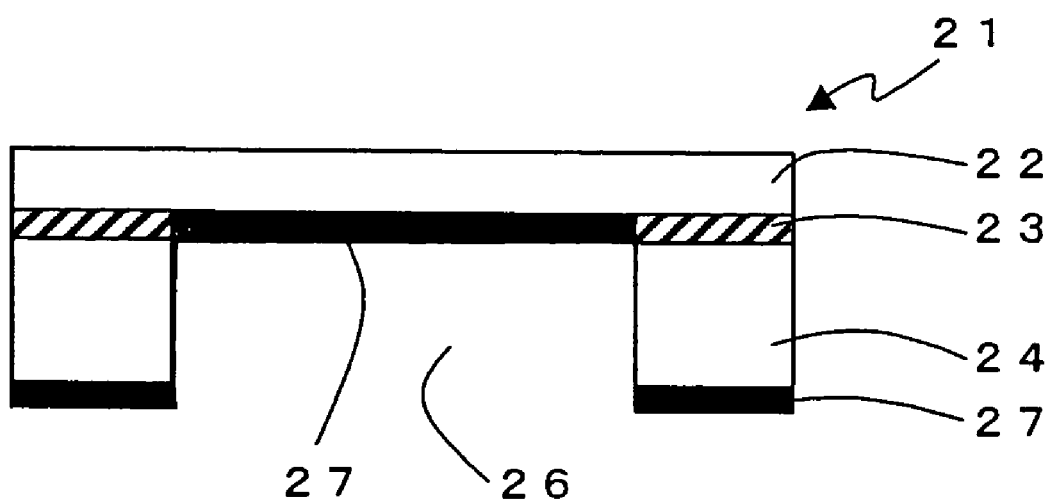
FIG. 2 is a partial sectional view showing another embodiment of a mask blank used for the electron-beam exposure according to the present invention.

FIG. 2 is a partial sectional view showing another embodiment of a mask blank for the electron-beam exposure of the present invention. The embodiment shown in FIG. 2 has a structure without hard mask layer on a front-side silicon membrane 22 of a mask blank 21. In this embodiment, an electron beam resist layer is directly formed on the silicon membrane 22, a resist pattern is formed, and the silicon membrane 22 is partially removed by pattern etching according to the resist pattern.

In case of forming a minute pattern by pattern etching as mentioned above, however, the embodiment shown in FIG. 1 with the hard mask layer on the silicon membrane is preferable.

(Method of Forming a Mask Blank and a Mask Used for the Charged Particle Beam Exposure)

Figure 3A:
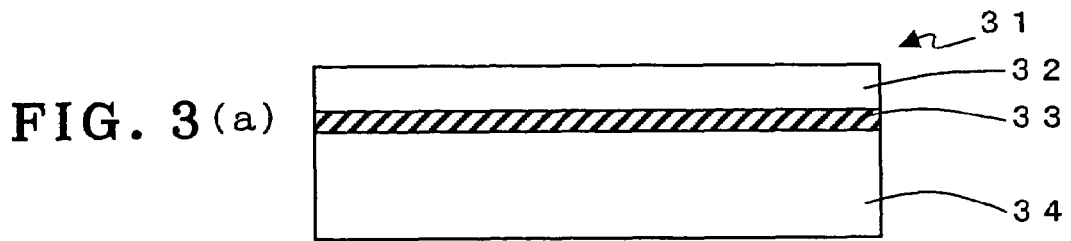
FIGS. 3(a)-3(e) are process charts showing a method of forming a mask blank and a mask used for the electron-beam exposure according to the embodiment of the present invention.
Figure 3B:
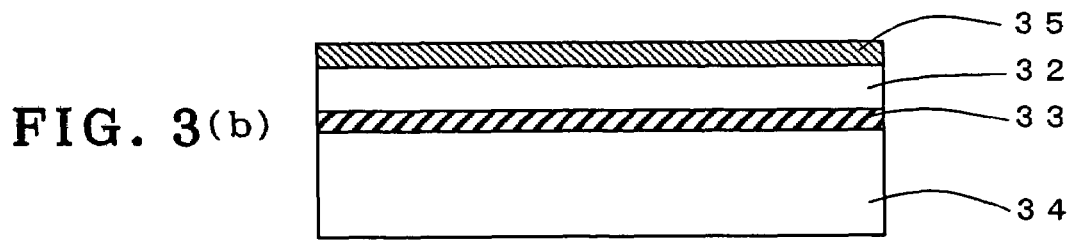
Figure 3C:
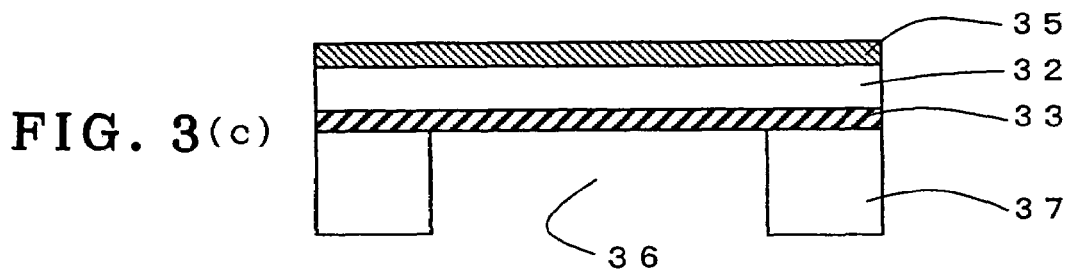
Figure 3D:
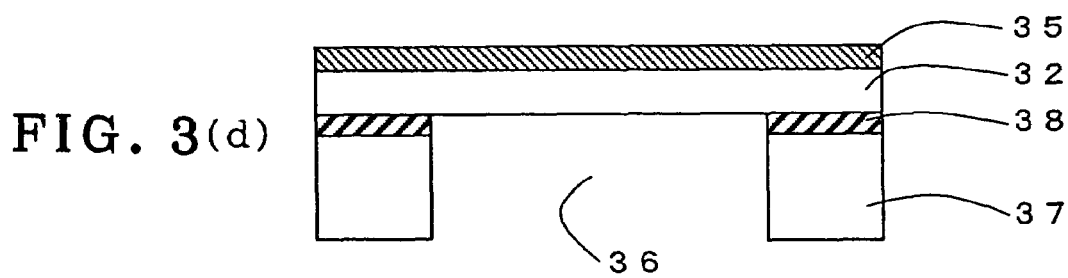
Figure 3E:
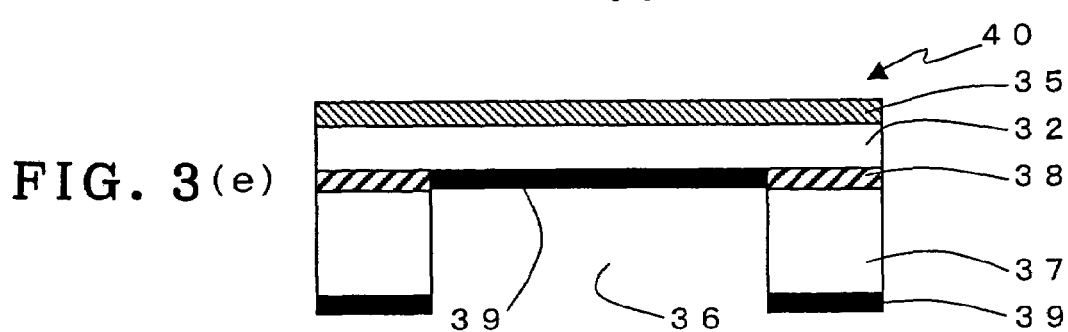

FIGS. 3(a)-3(e) and FIGS. 4(f)-4(g) following the process of FIG. 3(e) are process charts showing a method of forming a mask blank and a mask used for the electron-beam exposure according to the embodiment of the present invention shown in FIG. 1.

As shown in FIG. 3(a), an SOI substrate 31 is prepared. As the SOI substrate, a commercially available substrate can be used. The thickness of a front-side silicon membrane 32 of the SOI substrate 31 is 1 µm to several µm, the thickness of a back-side supporting silicon layer 34 is 500 µm to 725 µm, and the thickness of the silicon oxide film 33 is on the order of 0.2 µm to 1 µm.

Then, a hard mask layer 35 is formed on the silicon membrane 32 (FIG. 3(b)). As the material of the hard mask layer, one selected from a group consisting of Cr, Ti, Ta, Mo, W, and Zr and oxides, nitrides, and oxynitrides of these metals is used. The hard mask layer is formed to have a thickness of several hundreds nm by vacuum film deposition method such as sputtering. The hard mask layer is elective. In case of a mask blank used for the electron-beam exposure without forming the hard mask, an electron beam resist may be directly coated on the silicon membrane 32 as one of processes of the mask fabrication and the silicon membrane 32 is partially removed by etching according to the resist pattern of the resist layer. In case of forming a minute pattern by pattern etching, however, it is preferable to form the hard mask layer 35 in order to improve resistance to dry-etching.

The back-side supporting silicon layer 34 is removed at a portion corresponding to an opening by dry-etching. As an etching mask material during the dry-etching, a photoresist using novolak resin having resistance to dry-etching may be coated to have a thickness of 15 µm and is exposed and developed so as to form a predetermined resist opening. Alternatively, a thin film made of silicon such as silicon oxide or silicon nitride or a thin film made of metal such as Ti or W may be previously prepared and formed into a pattern by photo-etching, and the patterned thin film may be used as an etching mask (not shown). According to the etching mask thus formed, the supporting silicon layer 34 is partially removed by dry-etching with the silicon oxide film 33 functioning as the etching stop layer so as to form an opening 36. After that, the etching mask is removed (FIG. 3(c)).

The deep dry-etching of silicon can be carried out by an ICP-RIE (inductive coupled plasma-reactive ion etching) device which is commercially available. As etching gas, fluoro gases such as $SF_6$, $CF_4$, $C_2F_6$, and $C_4F_8$ may be used. For example, Bosch process may be employed in which dry etching is carried out with high density plasma with alternately supplying an $SF_6$ gas and a $C_4F_8$ gas. In order to speed up the etching, oxygen and/or nitrogen may be mixed in a minute amount within limits that have no influence on the mask material.

Then, the portion of the silicon oxide film 33 exposed to the opening 36 is removed using buffer hydrofluoric acid or the like (FIG. 3(d)).

An etching stop layer 39 having a lower internal stress is formed inside the opening 36, thus obtaining a mask blank 40

(FIG. 3(e)). The etching stop layer 39 functions as an etching stop layer during the dry-etching of the front-side silicon membrane 32 and is made of a material which provides a lower internal stress after formed, i.e. one selected from a group consisting of Cr, Ti, Ta, Mo, W, and Zr and nitrides, oxides, and oxynitrides of these metals. The thickness of the etching stop layer 39 is on the order of from 100 nm to 500 nm and can be formed by way of sputtering technique or CVD technique so as to control its stress.

The etching stop layer 39 is also formed on the bottoms of the supporting silicon layer 37 at the same time of the formation inside the opening 36. Depending on the kind of film deposition method, the etching stop layer 39 is also formed on the sides of the supporting silicon layer 37. But the formed layer on the sides of the supporting silicon layer 37 does not affect the characteristics of the mask blank 40 and the fabrication process of the mask. The etching stop layer 39 will be all removed during the mask fabrication process finally.

In the method of forming a mask for charged particle beam exposure of the present invention, as the front-side silicon membrane 32 is subjected to the dry-etching without the etching stop layer i.e. without any treatment after the silicon oxide film in the opening is removed (FIG. 3(d)), the etching gas leaks from the electron beam through-holes which have been formed earlier because there is no etching stop layer, thus causing a problem that even portions which are undesired to be removed are also removed by etching. Accordingly, the etching stop layer 39 is necessary for the mask fabrication process.

Then, an electron beam resist is coated on the mask blank 40 and a predetermined pattern is drawn by a mask electron beam writer and developed, thus forming a resist pattern. After that, the hard mask 35 is partially removed by etching to form a hard mask pattern 41. The etching condition depends on the material of the hard mask. After removing the resist pattern, the silicon membrane is removed partially at exposed portions by dry-etching so as to form a mask pattern 42 provided with electron beam through-holes 43 (FIG. 4(f)). Employed as the dry etching carried out on the silicon membrane for forming the mask pattern 42 must be high-precision trench etching. For example, a plasma etching using HBr gas may be employed.

Figure 4F:
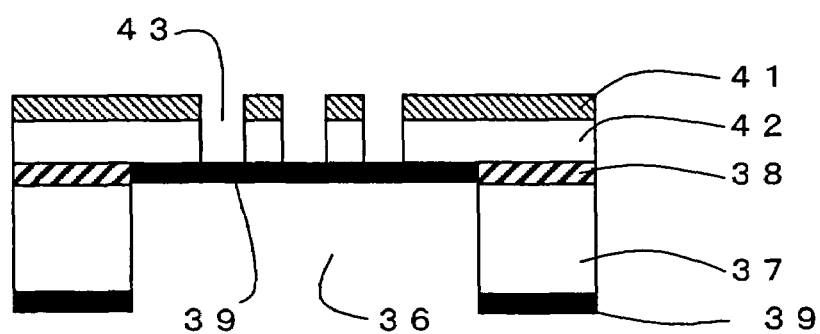
FIGS. 4(f)-4(g) are process charts following the process of FIG. 3(e) showing the method of forming the mask blank and the mask used for the electron-beam exposure.
Figure 4G:
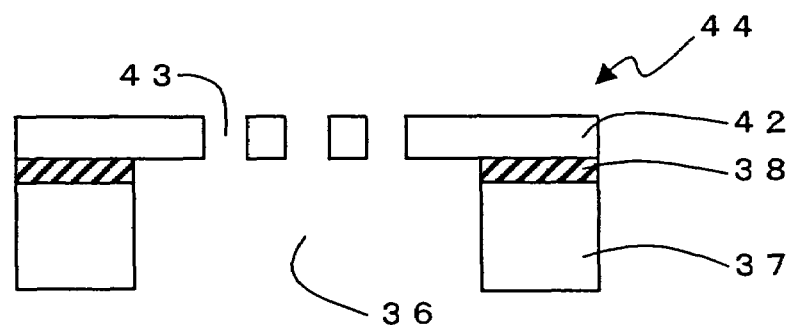
Figure 5A:
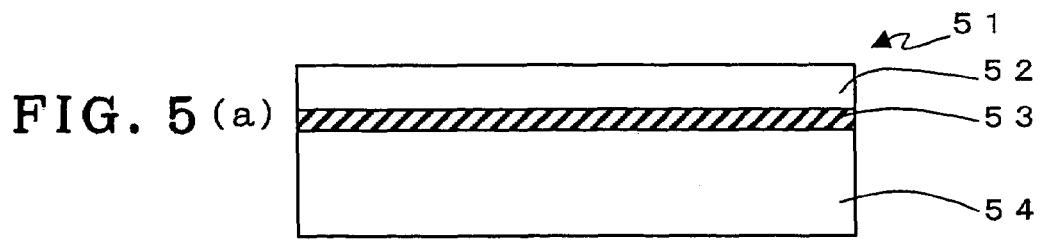
FIGS. 5(a)-5(e) are process charts showing a conventional method of forming a mask blank and a mask used for the electron-beam exposure.
Figure 5B:
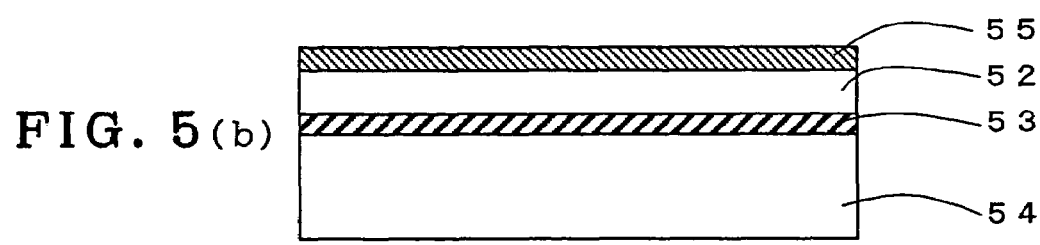
Figure 5C:
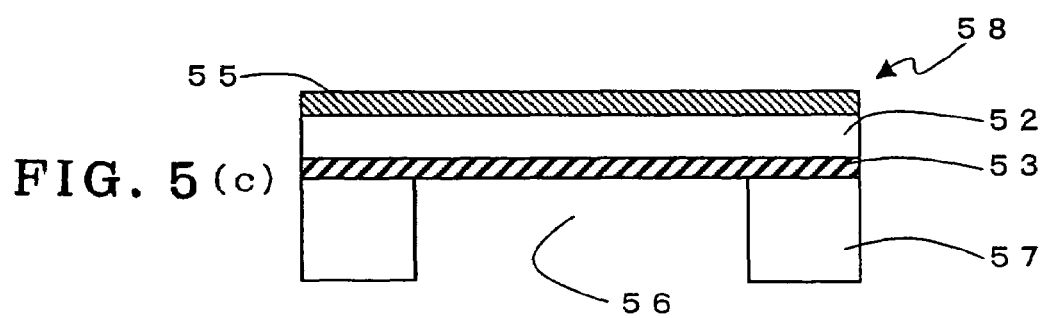
Figure 5D:
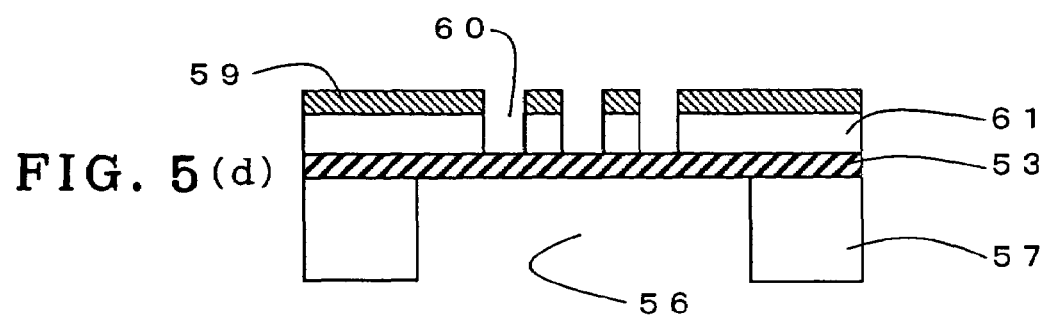
Figure 5E:
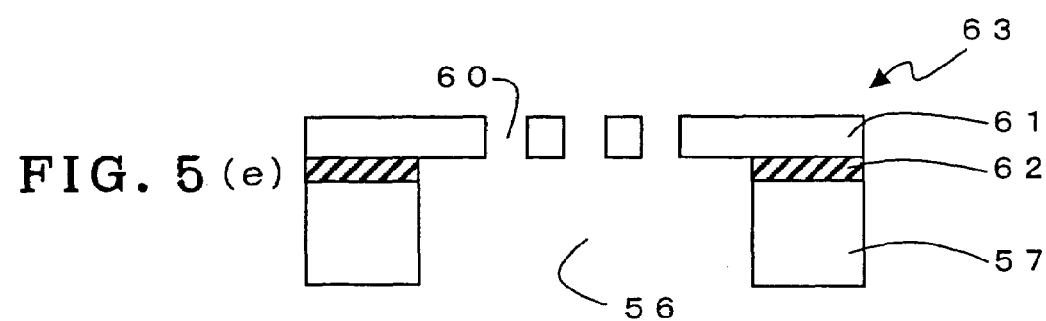
Figure 6:
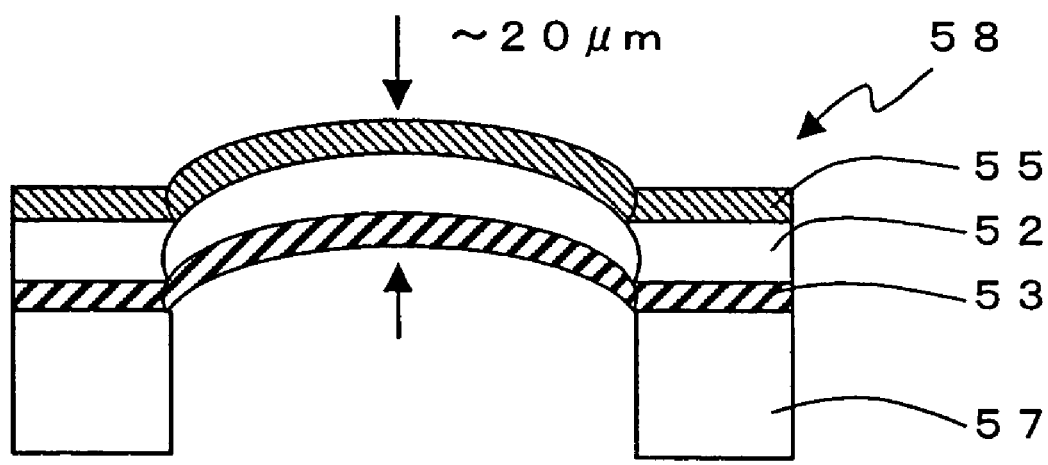
FIG. 6 is an illustration for explaining the deformation of a silicon membrane in the conventional mask blank used for the electron-beam exposure.

After that, the hard mask pattern 41 is removed by etching and the etching stop layer 39 in the opening and on the bottom of the supporting silicon layer (strut) is removed by etching, thereby forming a stencil mask 44 having the mask pattern 42 provided with the electron beam through-holes 43 (FIG. 4(g)).

Description will now be made as regard to concrete example of the present invention.

An SOI substrate of 8 inches was prepared. As for the SOI substrate, the thickness of a front-side silicon membrane was 2 μm, the thickness of a silicon oxide film at the middle was 1 μm, and the thickness of a back-side supporting silicon layer was 725 μm. The amount of boron doped in the silicon membrane was $2 \times 10^{19}$ atom/cm$^3$.

A hard mask layer of 200 nm in thickness was formed by sputtering Cr on the SOI substrate.

A photoresist using novolak resin was coated on the back-side supporting silicon layer to have a thickness of 15 μm and is exposed using a photo mask having an opening pattern and developed so as to form a resist pattern. As for the opening pattern, a unit of openings was 1.13×1.13 mm, and the width between the openings corresponding to the supporting silicon layer (strut) was 170 μm. The opening pattern comprises a plurality of the openings.

According to the aforementioned resist pattern, the back-side silicon was removed by dry-etching to have a depth of 725 μm to have openings, using Bosch process in which dry etching is carried out with an ICP-RIE etching device with alternately supplying an $SF_6$ gas and a $C_4F_8$ gas. After that, the resist pattern was removed by remover exclusively for resist pattern.

Then, portions of the silicon oxide film exposed to the openings were removed using buffer hydrofluoric acid (hydrofluoric acid:ammonium fluoride=1:10).

A film of 300 nm in thickness as an etching stop layer was formed in each opening by sputtering Cr having lower internal stress, thereby forming a mask blank.

An electron beam resist was coated on the mask blank and a predetermined pattern was drawn by a mask electron beam writer and developed, thus forming a resist pattern having lines and spaces of 260 nm. According to the resist pattern, the Cr of the hard mask was subjected to dry-etching to form a hard mask pattern. After that, the resist pattern was removed. According to the hard mask pattern of Cr, the silicon membrane was removed partially at the exposed portions by dry-etching using HBr gas so as to form a mask pattern with electron beam through-holes. The mask pattern had lines and spaces of 260 nm.

The Cr as the hard mask and the Cr as the etching stop layer were removed by etching using etching liquid of cerium (IV) diammonium nitrate series at the same time, thereby forming a stencil mask as the mask used for the electron beam exposure.

The stencil mask of this embodiment had openings of 1.13×1.13 mm formed in the back of the mask, supporting silicon layer (strut) of 170 μm in width and 725 μm in height, a mask pattern of 2 μm in thickness made of a single crystal silicon, and lines and spaces of 260 nm. Though the stencil mask of this embodiment had the same structure as a conventional one, it was a high-precision mask without shifting the position of pattern because it was made from a mask blank using an etching stop layer having lower stress.

According to the method of forming a mask blank and mask used for the charged particle beam exposure of the present invention as mentioned above, a mask blank and a mask used for the charged particle beam exposure which has excellent quality and high accuracy of position without shifting the position of an LSI pattern or the like can be obtained by employing a high-quality SOI substrate without defects and with thickness uniformity.

What is claimed is:

1. A mask blank used for a stencil mask comprising a silicon membrane defining through-holes for transmitting charged particle beams, which is made by employing an SOI substrate having a front-side silicon membrane and a back-side silicon layer with a silicon oxide film having a first internal stress interposed therebetween, wherein the back-side silicon layer of said SOI substrate and the silicon oxide film are partially removed to form an exposed region opening in which an etching stop layer having lower internal stress than said first internal stress is formed, and wherein said etching stop layer, which is removed at the time of mask processing, is made of any one selected from the group consisting of Cr, Ta, Mo, W, and Zr and nitrides, oxides, and oxynitrides of these metals.

2. A mask blank used for the charged particle beam exposure as claimed in claim 1, wherein a hard mask layer made of any one selected from a group consisting of Cr, Ti, Ta, Mo, W, and Zr and oxides, nitrides, and oxynitrides of these metals is formed on the front-side silicon membrane of said mask blank used for the charged particle beam exposure.

3. A mask blank used for the charged particle beam exposure as claimed in claim 2, wherein said etching stop layer and said hard mask layer are made of the same material.

* * * * *